United States Patent [19]

Ochi

[11] Patent Number: 4,558,365
[45] Date of Patent: Dec. 10, 1985

[54] HIGH-RESOLUTION HIGH-SENSITIVITY SOLID-STATE IMAGING SENSOR

[75] Inventor: Shigeharu Ochi, San Jose, Calif.

[73] Assignee: Fuji Photo Film Co., Ltd., Kanagawa, Japan

[21] Appl. No.: 501,332

[22] Filed: Jun. 6, 1983

[51] Int. Cl.$^4$ .............................................. H04N 3/14
[52] U.S. Cl. ....................................... 358/212; 358/44
[58] Field of Search ................. 358/213, 44, 209, 212; 357/24 LR

[56] References Cited

U.S. PATENT DOCUMENTS 4,012,587  3/1977  Ochi .............................. 357/24 LR
4,200,892  4/1980  Weimer ................................ 358/44

Primary Examiner—Gene Z. Rubinson
Assistant Examiner—Stephen Brinich
Attorney, Agent, or Firm—Sughrue, Mion, Zinn, Macpeak & Seas

[57] ABSTRACT

A solid-state imaging sensor, which may be a color imaging sensor, having simultaneously a high resolution and high sensitivity. The horizontally extending electrodes, which are connected to be driven by outputs of a vertical shift register, are formed in a flattened zig-zag pattern with alternate ones of the horizontally extending electrodes being offset in phase from one another. Source diffusions are formed in the octagonally shaped areas thereby produced. FET switching devices are provided for each of the source diffusions for selectively coupling the source diffusions to corresponding ones of vertically extending electrodes. The source diffusions form active layers of light-sensing photodiodes.

7 Claims, 16 Drawing Figures

HIGH-RESOLUTION HIGH-SENSITIVITY SOLID-STATE IMAGING SENSOR

BACKGROUND OF THE INVENTION

The invention pertains to a solid-state imaging sensor used for producing signals which represent the intensity of a light pattern. Such a solid-state imaging sensor may be used, for example, as a detector (target) in a television camera or electronic still camera.

Solid-state imaging sensors of the general type to which the invention pertains are composed of a matrix of pixels (picture elements) arranged in rows and columns. Each of the pixels receives light from a corresponding portion of the picture or image projected onto the sensor, and produces in response thereto an electrical signal representing the intensity of that portion.

As depicted in FIG. 1, one prior art approach to sensor construction was to form, on a semiconductor substrate 10, pixels 11 in a regular rectangular pattern of linear rows and linear columns on a semiconductor substrate 10. Horizontally extending electrodes and vertically extending electrodes (not shown in the view of FIG. 1) are provided, respectively, for actuating in sequence the various rows of pixels 11 and for receiving the signals read out from the rows of pixels. As is well known to those of ordinary skill in the art, the horizontally extending electrodes are connected to outputs of what is termed a "vertical shift register" for actuation.

Although the arrangement of FIG. 1 was acceptable for some applications, nevertheless, it suffered from some significant drawbacks. First, the resolution of the sensor, as measured by the number of pixels per unit distance in the horizontal direction, was limited. Secondly, because of the linear arrangement in both the row and column directions, moiré interference could occur when certain patterns were being sensed.

In an attempt to overcome these drawbacks, a pixel arrangement such as that illustrated in FIG. 2A has been proposed. In this arrangement, the pixels 11 are formed on the semiconductor substrate 10 in a staggered arrangement, that is, alternate rows of the pixels 11 are offset from one another in the row direction.

FIG. 2B is an enlarged top schematic view of the imaging sensor of FIG. 2A, and FIG. 2C is a cross-sectional view taken along a line A—A' in FIG. 2B. With reference now to FIG. 2B, the light sensitive area of each of the pixels 11 is defined by the area of a respective source diffusion 15 which forms both an active layer of a photodiode and the source of a switching FET device used for connecting the output of the photodiode to a respective one of the vertically extending lines. One end of each source diffusion 15 extends up to the edge of a corresponding horizontally extending electrode 18, and a drain diffusion 16 is formed on the opposite side of the horizontally extending electrode 18. The horizontally extending electrode is separated from the surface of the semiconductor substrate by a thin oxide layer so as to form a gate region 19 between each source diffusion 15 and drain diffusion 16. The drain diffusions 16 are connected to respective vertically extending lines 24 (see FIG. 2C, omitted in FIG. 2B for clarity).

With specific reference to FIGS. 2C, each source diffusion 15 may be an N+-type diffusion formed in a P well 26. A P+ region 25 is formed under the N+-type diffusion 15 on an N-type substrate 27. In this manner, the source diffusion 15 forms a photodiode with the P+ region 25 and P-type well 26. Each horizontally extending electrode 18 is insulated from the vertically extending electrodes 24 by an insulating oxide layer 20. If the imaging sensor is to be a color imaging sensor, a color filter 23 is provided over each source diffusion 15 with the various color filters of the array being provided in a pattern appropriate for color imaging. The color filters 23 are embedded in protective layer 22.

The arrangements of FIGS. 2A–2C is advantageous over the one depicted in FIG. 1 in that the resolution of the sensor is improved and moiré fringing effects are reduced. However, the sensor of FIGS. 2A–2C is still not fully acceptable for many applications because its sensitivity is not sufficient.

The sensitivity of a pixel can be determined by dividing its photosensitive area (the area defined by the source diffusion 15 in the sensor of FIGS. 2A–2C) by the total area of the pixel. Thus, it can be seen that by increasing the number of pixels per unit distance in the row direction in the arrangement of FIGS. 2A–2C in order to improve the resolution of the sensor, for a given minimum photolithographic definition, for example, a given minimum width of one of the horizontally or vertically extending electrodes, the sensitivity of the sensor is lowered.

Accordingly, it is an object of the present invention to provide a solid-state imaging sensor of the same general type described above, but in which both the resolution and sensitivity are improved over prior art approaches.

SUMMARY OF THE INVENTION

This, as well as other objects of the invention, are met by a solid-state imaging sensor including a grid of electrodes composed of first and second sets of electrodes within each set of which the electrodes are generally parallel to one another and wherein electrodes of the first and second sets are arranged generally perpendicular to one another, a plurality of light sensing means arranged in a matrix of rows and columns with each of the light sensing means being selectively couplable to a respective one of the first set of electrodes for receiving therefrom a signal for effecting read out of the particular light sensing means and also to a respective one of the second set of electrodes for outputting onto that one of the second set of electrodes light intensity information from the particular light sensing means, wherein the improvement comprises at least one of the first and second sets of electrodes being composed of electrodes formed in an undulating pattern with adjacent ones of the electrodes being phased oppositely from one another. By "phase oppositely from one another" is meant, for a given frame of reference, the troughs of one of the electrodes are immediately adjacent the peaks of an adjacent electrode so that the electrodes appear to be shifted 180° from one another. It is preferred that the at least one of the first and second sets of electrodes be the first set of electrodes, that is, the electrodes which are used to actuate read out of the light sensing means.

Each of the light sensing means is disposed in an area between adjacent ones of the first set of electrodes where they diverge from one another, that is, the light sensing means are formed in enlarged areas between outwardly going undulations of electrodes of the first set of electrodes on either side of the light sensing means. Switching means, which preferably take the form of FET devices, are provided for coupling the light sensing means to respective ones of the second set of electrodes in response to the signals on corresponding ones of the first set of electrodes. Each of these switching means is disposed in an area where the adjacent ones of the electrodes of the first set of electrode converge towards one another, and between two light sensing areas other than the one to which it is connected. The FET switching devices may be provided in pairs having drains connected together and gates coupled to and formed by portions of adjacent ones of the first set of electrodes at positions where adjacent ones of the first set of electrodes converge, that is, where they are most closely adjacent one another.

The undulating pattern of each of the electrodes of the first set of electrodes may take the form of a zig-zag pattern, particularly, a zig-zag pattern having flattened sides. In the latter case, the areas in which the light sensing means are disposed will be generally octagonally shaped, and, hence, the light sensing means themselves are preferable generally octagonally shaped to make maximum use of the available area for photosensing. In the case that the imager is to be used for color imaging, color filters are arranged over the light sensing means in an appropriate pattern.

More specifically, the invention may be practiced by a solid-state imaging sensor including a semiconductor substrate, first and second sets of electrodes arranged perpendicular to one another with electrodes within each set being generally parallel to one another and with electrodes of the first set being formed in an undulating pattern with adjacent ones of the electrodes of the first set being phased oppositely from one another, a light sensing element formed in the semiconductor substrate in each of the enlarged areas which are formed between diverging undulations in the electrodes of the first set of electrodes, and a plurality of FET devices for selectively coupling outputs of each of the light sensing elements to the appropriate one of the electrodes of the second set of electrodes in response to a signal on a respective one the electrodes of the first set of electrodes. By arranging the electrodes of the first set of electrodes in this manner, rows of enlarged areas are formed in the horizontal direction of the sensor with adjacent rows of enlarged areas being staggered from one another. By "staggered from one another" is meant that a line connecting centers of a given column (vertical direction) of the enlarged areas, and hence of the light sensing elements, falls substantially half-way between adjacent lines connecting centers of enlarged areas on either side of the given column of enlarged areas. It is also mentioned that directional terms such as horizontal, vertical, row and column are used herein only for convenience in description and their usage does not apply are particular requirement as to the orientation of the finished image sensor relative to any other component or to the image being sensed.

The light sensing elements in one preferred embodiment are formed by photodiodes in which the source diffusion of the FET devices also form an active layer of the respective photodiodes. The FET devices are provided preferably in pairs with a common drain area and gates formed at areas where a respective pair of adjacent ones of the electrodes of the first set of electrodes are most close to one another, that is, in areas where they converge. By forming the electrodes of the first set of electrodes in a zig-zag pattern having flattened sides, the enlarged areas, and hence the light sensing elements, are made generally octagonal. This provides an improved sensitivity for each pixel by maximizing the light sensitive area of each pixel, while at the same time significantly reducing Moiré fringing effects.

BRIEF DESCRIPTION OF THE DRAWINGS

FIGS. 2A-2B illustrate another solid-state imaging sensor of which FIG. 2A is a top view similar to FIG. 1, FIG. 2B is an enlarged schematic top view of a portion of FIG. 2A.

FIGS. 5A-8C illustrate steps in the construction of a solid-state imaging sensor of the type shown in FIG. 4 of which FIGS. 5A-8A are top views, FIG. 8C is a cross-sectional view taken along a line G—G' in FIG. 8A.

DESCRIPTION OF THE PREFERRED EMBODIMENTS

Referring first to the top schematic view of FIG. 3, a first embodiment of a solid-state imaging sensor constructed in accordance with the teachings of the present invention will be described.

Figure 1:
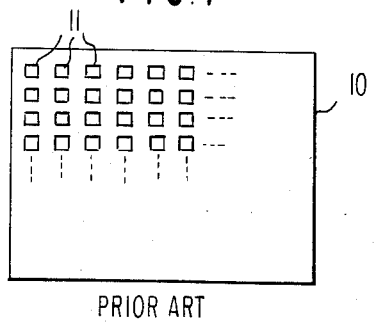
FIG. 1 is a top view of a prior art solid-state imaging sensor.
Figure 2A:
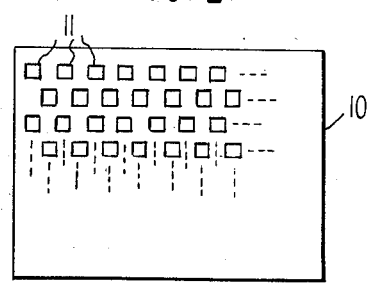
Figure 2B:
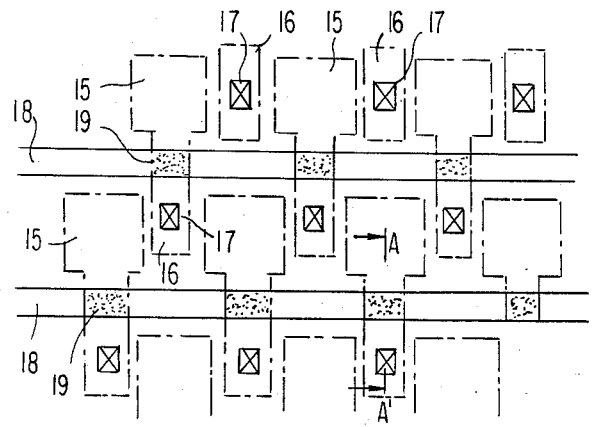

In accordance with the invention, the horizontally extending electrodes 34 of the solid-state imaging sensor are formed in a zig-zag pattern with adjacent ones of the electrodes 34 offset in phase from one another by 180° (flattened zig-zag pattern). By so doing, rows of octagonally shaped enlarged areas are formed at regular spaced intervals with adjacent rows being staggered. Source diffusions 31, also having an octagonal shape, are formed in these enlarged areas. Drain diffusions 32 and drain contact areas 35 are formed in the small areas between adjacent enlarged areas, that is, in areas where the adjacent electrodes 34 converge towards one another. As in the case of the device of FIG. 2B, the source diffusions 31 and the drain diffusions 32 extend on the semiconductor substrate up to positions adjacent the edges of a respective horizontal extending electrode 34, and a gate region 33 is formed therebetween by separating the respective horizontal extending electrode 34 from the surface of the substrate by a thin oxide layer.

Figure 3:
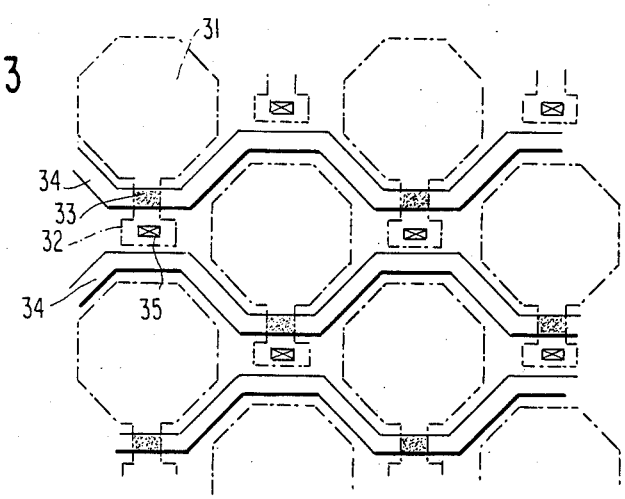
FIG. 3 is a top schematic view, similar in content to FIG. 2A, but illustrating a solid-state imaging sensor of the invention.
Figure 4:
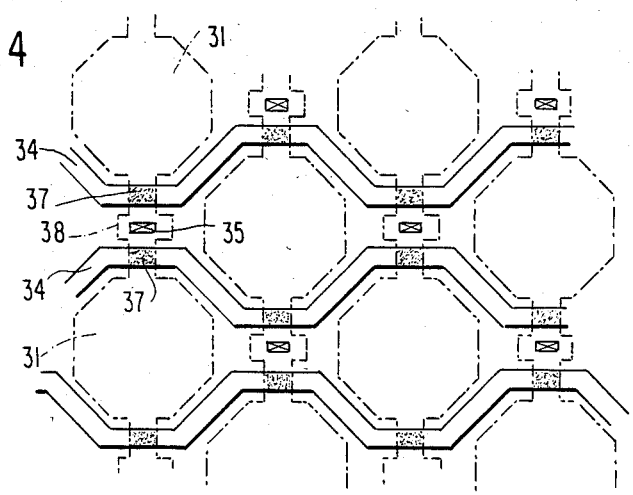
FIG. 4 is view similar to FIG. 3 showing an alternative embodiment of a solid-state imaging sensor of the invention.

FIG. 4 illustrates another embodiment of the invention, similar to the embodiment of FIG. 3, but in which each drain diffusion 38 serves as a drain area for two adjacent source diffusions 31. In this case, each drain diffusion 38 extends up to the edge of the two adjacent horizontally extending electrodes 34, and gate regions 37 are formed under both adjacent horizontally extending electrodes 34. The embodiment of FIG. 4 is particularly advantageous in the case where the sensor is to be a color imaging sensor because, for purposes of interlaced scanning, and as explained in my co-pending U.S. patent application Ser. No. 478,975, it is necessary to activate only one of the horizontally extending electrodes 34 at a time.

The fabrication of a solid-state imaging sensor of the invention, of the type depicted in FIG. 4 as an example, will now be described.

Figure 5A:
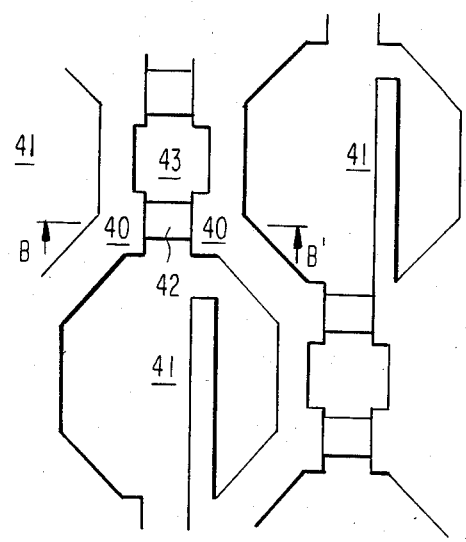
Figure 5B:
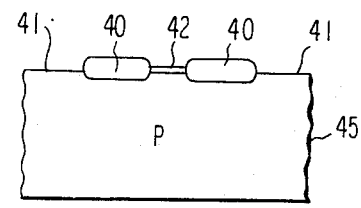
FIG. 5B is cross-sectional view taken along a line B—B' in FIG. 5A.

As shown first in FIGS. 5A and 5B, relatively thick regions 40 of field oxide are grown in a vertically extending, generally zig-zag pattern on the surface of a P-type layer 45 of an N-type substrate (not shown). Thin oxide layers 42, which will later be used to form the gate regions, are formed on the surface of the semiconductor substrate.

Figure 6A:
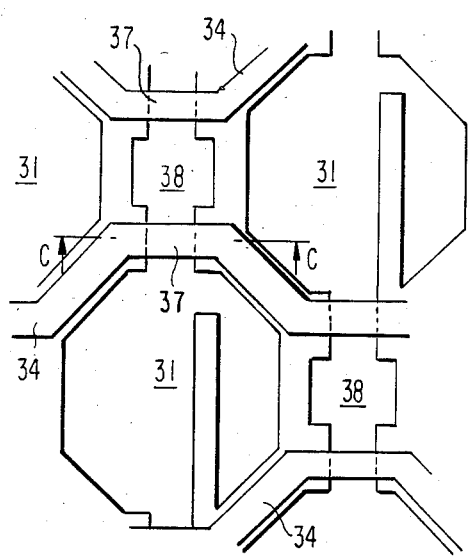
Figure 6B:
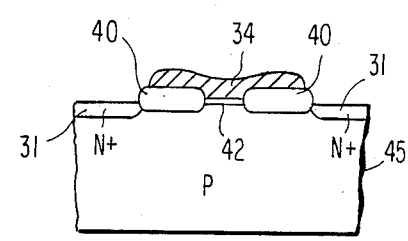
FIG. 6B is a cross-sectional view taken along a line C—C' in FIG. 6A.

Next, as illustrated in FIGS. 6A and 6B, the horizontally extending electrodes 34 are etched in the flattened-side zig-zag pattern discussed above following deposition of polysilicon material. Then, the exposed areas of the semiconductor substrate are implanted with a suitable dopant material. Preferably, the dopant is an $N^+$-type.

Figure 7A:
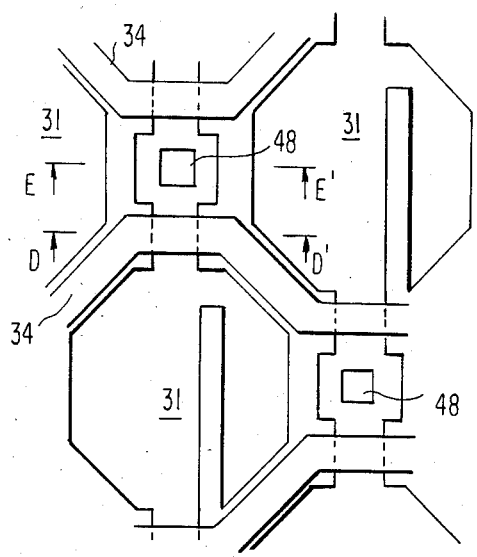
Figure 7B:
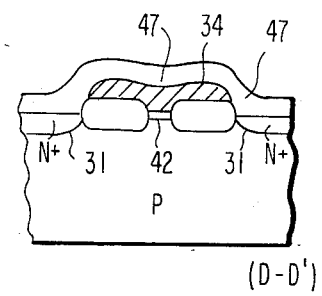
FIG. 7B is a cross-sectional view taken along a line D—D' in FIG. 7A.
Figure 7C:
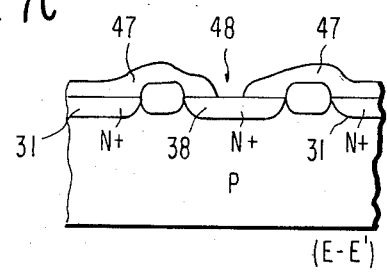
FIG. 7C is a cross-sectional view taken along a line E—E' in FIG. 7A.

Referring next to FIGS. 7A–7C, a layer 47 of PSG (phosphor glass) is deposited over the surface of the device and then etched in regions 48 where the drain contacts are to be made.

Figure 8A:
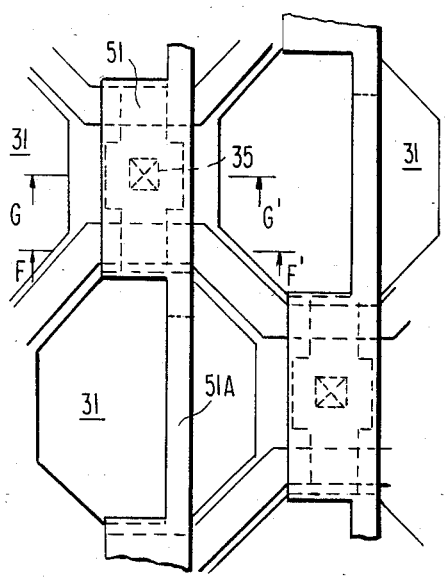
Figure 8B:
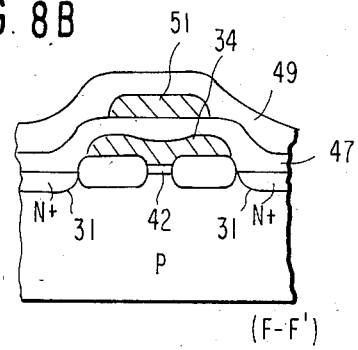
FIG. 8B is a cross-sectional view taken alone a line F—F' in FIG. 8A.
Figure 8C:
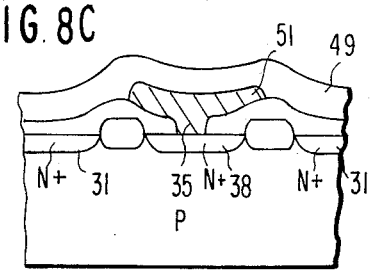

Finally, as illustrated in FIGS. 8A–8C, verticallyextending electrodes 51, having reduced width portions 51A above the source diffusions 31, are laid down in contact with the drain contacts 35. A protective layer 49, which may be another oxide layer, is formed over the surface of the entire device.

Figure 2C:
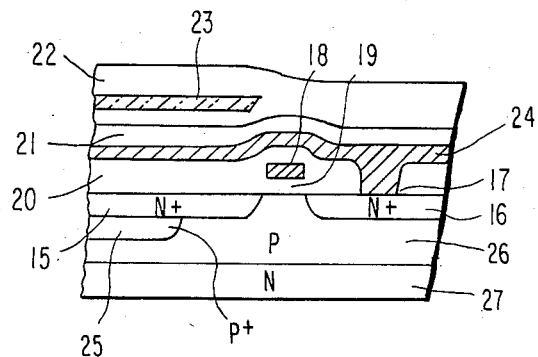
FIG. 2C is an enlarged cross-sectional view taken along a line A—A' indicated in FIG. 2B.

Of course, for the completion of the photodiode portions of the sensor, it is necessary to provide layers such as the $P^+$ layer 25 of FIG. 2C. However, as this is standard, the $P^+$ layer has been omitted for purposes of clarity of illustration.

This completes the description of the preferred embodiments of the invention. Although preferred embodiments have been described, it is believed that numerous modifications and alterations thereto would be apparent to one of ordinary skill in the art without departing from the spirit and scope of the invention.

I claim:

1. A solid-state imaging sensor comprising:
    a semiconductor substrate;
    a first set of electrodes disposed on said semiconductor substrate, each electrode of said first set of electrodes being formed in an undulating pattern with adjacent ones of said first set of electrodes being phased oppositely from one another to form enlarged areas at predetermined intervals between pairs of adjacent ones of said electrodes of said first set of electrodes, one row of said enlarged areas being formed between each two adjacent ones of said electrodes of said first set of electrodes, and adjacent rows of said enlarged areas being staggered with respect to one another;
    a second set of electrodes disposed on said semiconductor substrate comprising electrodes disposed generally perpendicular to said electrodes of said first set of electrodes, ones of said electrodes of said second set of electrodes extending across respective aligned peaks and troughs of said first electrodes, all electrodes of said first and second sets of electrodes being electrically insulated from one another;
    a plurality of light sensing elements formed in said semiconductor substrate, one of said light sensing elements being formed in each of said enlarged areas; and
    a plurality of FET devices, one of said FET devices being provided for each of said light sensing elements, each of said FET devices comprising a source coupled to a respective light sensing element, a gate formed by and coupled to a respective one of said first electrodes, and a drain coupled to a respective one of said second electrodes, said drain being formed in said semiconductor substrate between two of said enlarged areas;
    wherein each said light sensing element comprises a photodiode; and wherein said source of each of said FET devices extends over an area of a respective photodiode and forms an active layer of said photodiode.

2. The solid-state imaging sensor of claim 1, wherein said FET devices are arranged in pairs of FET devices having drains connected together and gates formed by and coupled to respective adjacent ones of said first set of electrodes at positions where said adjacent ones of said first set of electrodes are most closely adjacent one another.

3. The solid-state imaging sensor of claim 2, wherein each of said first set of electrodes has a flattened zig-zag pattern having a first section extending parallel to a longitudinal direction of the electrode, a second section extending at an acute angle to said longitudinal direction, a third section extending parallel to said longitudinal direction, and a fourth section extending at an angle to said longitudinal direction complementary to said acute angle.

4. The solid-state imaging sensor of claim 3, wherein each of said light sensing means is generally octagonally shaped.

5. The solid-state imaging sensor of claim 3, further comprising a plurality of color filters, said filters being arranged in a predetermined pattern suitable for color imaging, and each of said color filters being disposed over a respective one of said light sensing means.

6. The solid-state imaging sensor of claim 1, wherein each of said enlarged areas and each of said light sensing elements are generally octagonally shaped.

7. A solid-state imaging sensor comprising:
    a semiconductor substrate;
    a first set of electrodes disposed on said semiconductor substrate, each electrode of said first set of electrodes being formed in an undulating pattern with adjacent ones of said first set of electrodes being phased oppositely from one another to form enlarged areas at predetermined intervals between pairs of adjacent ones of said electrodes of said first set of electrodes, one row of said enlarged areas being formed between each two adjacent ones of said electrodes of said first set of electrodes, and adjacent rows of said enlarged areas being staggered with respect to one another;
    a second set of electrodes disposed on said semiconductor substrate comprising electrodes disposed generally perpendicular to said electrodes of said first set of electrodes, ones of said electrodes of said second set of electrodes extending across respective aligned peaks and troughs of said first electrodes, all electrodes of said first and second sets of electrodes being electrically insulated from one another;
    a plurality of light sensing elements formed in said semiconductor substrate, one of said light sensing elements being formed in each of said enlarged areas; and a plurality of FET devices, one of said FET devices being provided for each of said light sensing elements, each of said FET devices comprising a source coupled to a respective light sensing element, a gate formed by and coupled to a respective one of said first electrodes, and a drain coupled to a respective one of said second electrodes, said drain being formed in said semiconductor substrate between two of said enlarged areas;

wherein said FET devices are provided in pairs with a common drain area and gates formed at areas where a respective pair of adjacent ones of said electrodes of said first set of electrodes are most close to one another.

* * * * *